US012744186B2

(12) United States Patent
Watanabe et al.

(10) Patent No.: US 12,744,186 B2
(45) Date of Patent: Sep. 22, 2026

(54) PLASMA PROCESSING APPARATUS AND PLASMA PROCESSING METHOD

(71) Applicant: Tokyo Electron Limited, Tokyo (JP)

(72) Inventors: Shuto Watanabe, Yamanashi (JP); Yuki Osada, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 15 days.

(21) Appl. No.: 18/969,148

(22) Filed: Dec. 4, 2024

(65) Prior Publication Data

US 2025/0201522 A1 Jun. 19, 2025

(30) Foreign Application Priority Data

Dec. 18, 2023 (JP) ................................ 2023-213147

(51) Int. Cl.
*H01J 37/32* (2006.01)

(52) U.S. Cl.
CPC .. *H01J 37/32183* (2013.01); *H01J 37/32128* (2013.01); *H01J 37/32137* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 6,887,339 B1 * | 5/2005 | Goodman | ......... | H01J 37/32082 156/345.47 |
| 8,471,477 B2 * | 6/2013 | Tomita | ............. | H01J 37/32183 315/111.21 |
| 11,315,765 B2 * | 4/2022 | Yamawaku | ....... | H01J 37/32577 |
| 2002/0159276 A1 * | 10/2002 | Deboy | ............. | H02M 3/33507 363/20 |
| 2023/0050119 A1 | 2/2023 | Martinez et al. | | |
| 2023/0178338 A1 | 6/2023 | Otomo | | |

FOREIGN PATENT DOCUMENTS

| | | |
|---|---|---|
| JP | 2023-082889 A | 6/2023 |
| KR | 10-2023-0084045 A | 6/2023 |

* cited by examiner

*Primary Examiner* — Kenneth B Wells
(74) *Attorney, Agent, or Firm* — Fenwick & West LLP

(57) ABSTRACT

A plasma processing apparatus comprises a processing chamber configured to form a processing space, an application electrode disposed on one side of the processing space and connected to a high-frequency power supply, a counter electrode disposed on the other side of the processing space, and a phase control circuit configured to include a semiconductor switch and connected to the counter electrode. An ON signal shorter than one cycle of a high-frequency signal outputted from the high-frequency power supply, which is a control signal, is inputted to the semiconductor switch in synchronization with the frequency of the high-frequency signal.

16 Claims, 6 Drawing Sheets

PLASMA PROCESSING APPARATUS AND PLASMA PROCESSING METHOD

CROSS-REFERENCE TO RELATED APPLICATIONS

This application claims priority to Japanese Patent Application No. 2023-213147 filed on Dec. 18, 2023, the entire contents of which are incorporated herein by reference.

TECHNICAL FIELD

The present disclosure relates to a plasma processing apparatus and a plasma processing method.

BACKGROUND

The plasma processing apparatus disclosed in Japanese Laid-open Patent Publication No. 2023-082889 includes a chamber, an upper electrode, a gas supply part, a high-frequency power supply, a first measuring device, a second measuring device, a detector, an impedance adjustment device, and a controller. The lower electrode may be included in a substrate support disposed in the chamber and configured to support a substrate thereon. The upper electrode may be disposed in the chamber to face the lower electrode. The gas supply part may be configured to supply a processing gas to the gap between the upper electrode and the lower electrode. The high-frequency power supply may be electrically connected to the upper electrode and configured to generate plasma of the processing gas by applying a high-frequency voltage to the upper electrode. The first measuring device may be configured to measure a potential waveform of the upper electrode. The second measuring device may be configured to measure a potential waveform of the lower electrode. The detector may detect a voltage waveform obtained by subtracting a second potential measured by the second measuring device from a first potential waveform measured by the first measuring device. The impedance adjustment device may be configured to adjust the impedance of the lower electrode. The controller may be configured to control the impedance adjustment device to adjust the impedance of the lower electrode based on the voltage waveform detected by the detector.

SUMMARY

The present disclosure provides a plasma processing apparatus and a plasma processing method that can control an impedance of a counter electrode to follow a frequency of a high-frequency signal.

A plasma processing apparatus according to one embodiment of the present disclosure comprises a processing chamber, an application electrode, a counter electrode and a phase control circuit. The processing chamber is configured to form a processing space. The application electrode is disposed on one side of the processing space and connected to a high-frequency power supply. A counter electrode is disposed on the other side of the processing space. A phase control circuit is configured to include a semiconductor switch and connected to the counter electrode. An ON signal shorter than one cycle of a high-frequency signal output from the high-frequency power supply is input to the semiconductor switch in synchronization with the frequency of the high-frequency signal.

DETAILED DESCRIPTION

Hereinafter, embodiments of a plasma processing apparatus and a plasma processing method of the present disclosure will be described in detail with reference to the accompanying drawings. Further, the following embodiments are not intended to limit the present disclosure.

As a plasma processing apparatus that generates capacitively coupled plasma (CCP), there is known a lower electrode is provided with a phase controller, and an impedance seen from an upper electrode is varied to control distribution of the plasma, for example. In such a phase controller, for example, a vacuum variable capacitor is varied by a mechanical driving system to vary an impedance from less than one second to several seconds. On the other hand, in an atomic layer process (ALP), plasma ignition in which a gas type is switched or a high-frequency power is switched in a stepwise manner at intervals of several seconds during a process recipe may be performed. Therefore, it is difficult for a mechanical phase controller to perform impedance control that follows a process recipe. Hence, it is expected that an impedance of a counter electrode can be controlled to follow the frequency of the high-frequency signal.

<Configuration of Plasma Processing Apparatus>

Figure 1:
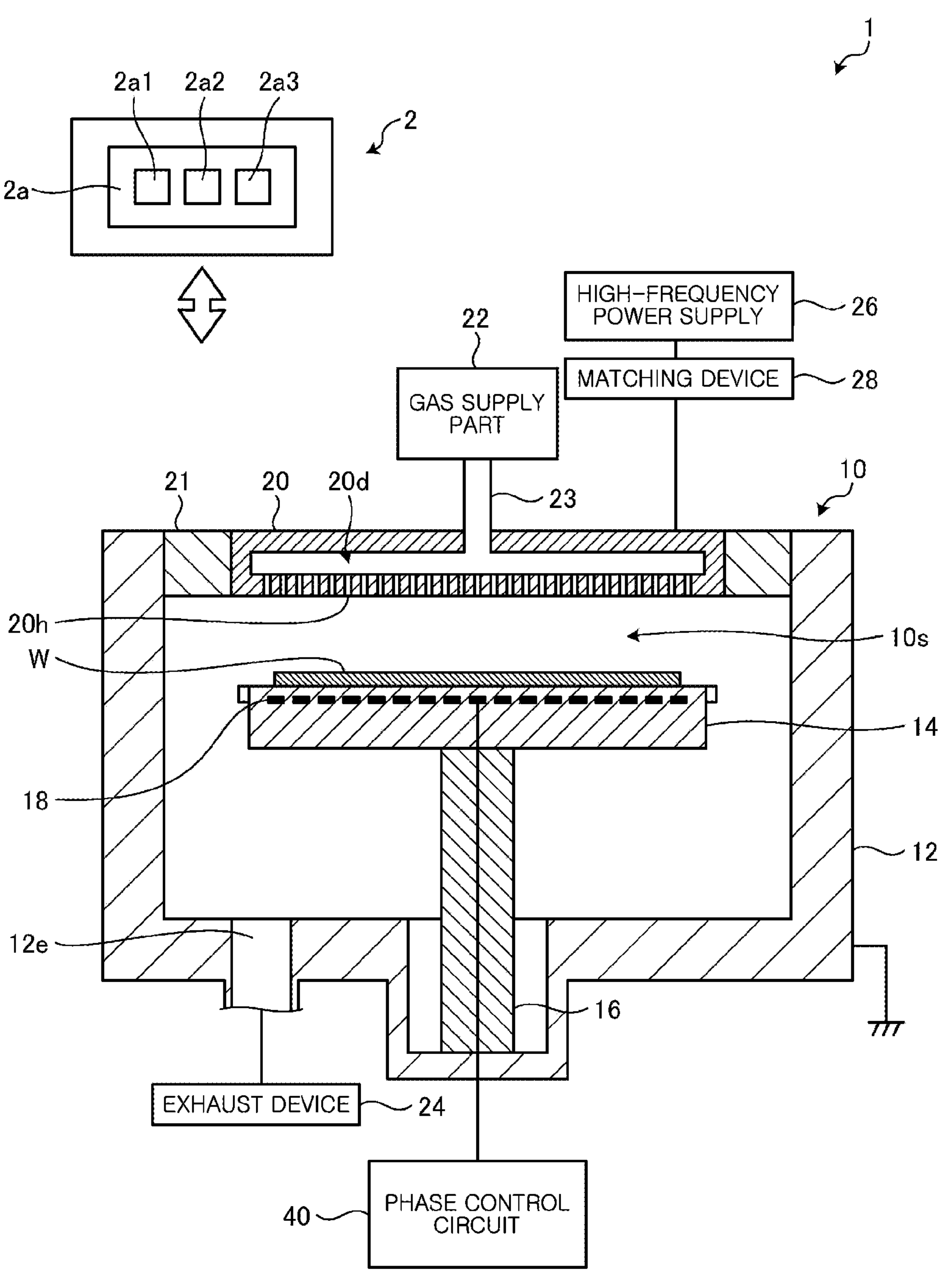
FIG. 1 is a schematic cross-sectional view showing an example of a configuration of a plasma processing apparatus according to an embodiment of the present disclosure.

FIG. 1 is a schematic cross-sectional view showing an example of a configuration of a plasma processing apparatus according to an embodiment of the present disclosure. A plasma processing apparatus 1 shown in FIG. 1 includes a controller 2 and a chamber 10. The chamber 10 provides an inner space therein. The chamber 10 may include a chamber body 12. The chamber body 12 has a substantially cylindrical shape. The inner space (processing space 10*s*) of the chamber 10 is provided in the chamber body 12. The chamber body 12 is made of a metal such as aluminum. The chamber body 12 is electrically grounded. Further, the sidewall of the chamber body 12 may provide a passage through which a substrate W passes when it is transferred. In addition, a gate valve may be disposed along the sidewall of the chamber body 12 to open and close the passage.

The plasma processing apparatus 1 further includes a substrate support 14. The substrate support 14 is disposed in the chamber 10. The substrate support 14 is configured to support the substrate W placed thereon. The substrate support 14 has a main body. The main body of the substrate support 14 is made of, e.g., aluminum nitride, and may have a disc shape. The substrate support 14 may be supported by a support member 16. The support member 16 extends upward from the bottom portion of the chamber 10. The substrate support 14 includes a lower electrode 18. The lower electrode 18 is included in the substrate support 14, and is embedded in the main body of the substrate support 14. The lower electrode 18 is an example of the counter electrode.

The plasma processing apparatus 1 further includes an upper electrode 20. The upper electrode 20 is disposed in the chamber 10, and is disposed above the substrate support 14. The upper electrode 20 is disposed to face the lower electrode 18. The upper electrode 20 constitutes the ceiling portion of the chamber 10. The upper electrode 20 is electrically isolated from the chamber body 12. In one embodiment, the upper electrode 20 is fixed to the upper part of the chamber body 12 via an insulating member 21. Further, the upper electrode 20 is an example of an application electrode.

In one embodiment, the upper electrode 20 is configured as a shower head. The upper electrode 20 provides a gas diffusion space 20*d* therein. Further, the upper electrode 20 provides a plurality of gas holes 20*h*. The plurality of gas holes 20*h* extend downward from the gas diffusion space 20*d*, and are opened toward the inner space of the chamber 10. In other words, the plurality of gas holes 20*h* connect the gas diffusion space 20*d* to the inner space of the chamber 10 (the processing space 10*s*).

The plasma processing apparatus 1 further includes a gas supply part 22. The gas supply part 22 is configured to supply a gas into the chamber 10. The gas supply part 22 is configured to supply a processing gas to the gap between the upper electrode 20 and the lower electrode 18. The gas supply part 22 is connected to the gas diffusion space 20*d* via a line 23. The gas supply part 22 may have one or more gas sources, one or more flow rate controllers, and one or more on-off valves. Each of the one or more gas sources is connected to the line 23 via a corresponding flow rate controller and a corresponding on-off valve.

In one embodiment, the gas supply part 22 may supply a film forming gas. In other words, the plasma processing apparatus 1 may be a film forming apparatus. A film formed on the substrate W using the film forming gas may be an insulating film. In another embodiment, the gas supply part 22 may supply an etching gas. In other words, the plasma processing apparatus 1 may be a plasma etching apparatus.

The plasma processing apparatus 1 further includes an exhaust device 24. The exhaust device 24 includes a pressure controller such as an automatic pressure control valve and a vacuum pump such as a turbo molecular pump or a dry pump. The exhaust device 24 is connected to the inner space of the chamber 10 via an exhaust line from an exhaust port 12*e* disposed at the bottom portion of the chamber body 12.

The plasma processing apparatus 1 further includes a high-frequency power supply 26. The high-frequency power supply 26 is electrically connected to the upper electrode 20 via a matching device 28. The high-frequency power supply 26 may include the matching device 28. The high-frequency power supply 26 is configured to generate plasma of the processing gas supplied from the gas supply part 22 to the gap between the upper electrode 20 and the lower electrode 18 by applying a high-frequency voltage to the upper electrode 20. In one embodiment, the high-frequency power supply 26 generates a high-frequency power. The frequency of the high-frequency power may be any frequency. The frequency of the high-frequency power may be, e.g., 13.56 MHz or less. The frequency of the high-frequency power may be, e.g., 2 MHz or less. The frequency of the high-frequency power may be, e.g., 20 KHz or more. Further, when the high-frequency power is a high-frequency signal that generates plasma, it can also be referred to as a source radio frequency (RF) signal or a source RF power.

The high-frequency power supply 26 is connected to the upper electrode 20 via the matching device 28. The high-frequency power from the high-frequency power supply 26 is supplied to the upper electrode 20 via the matching device 28. The matching device 28 has a matching circuit that matches an impedance of a load of the high-frequency power supply 26 to an output impedance of the high-frequency power supply 26. In addition to the high-frequency power, a bias signal that generates a bias potential on the substrate W may be supplied to the upper electrode 20. The bias signal may be a high-frequency signal, a direct current (DC) pulse, or a DC voltage. When a DC voltage is supplied to the upper electrode 20, a DC power supply may be included. Further, when the bias signal is a high-frequency signal, it can also be referred to as a bias RF signal or a bias RF power.

In another embodiment, a DC voltage pulse may be periodically applied to the upper electrode 20. The frequency that defines the period in which the DC voltage pulse is applied to the upper electrode 20 is, e.g., 10 KHz or higher and 10 MHz or less.

When the plasma processing is performed on the substrate W in the plasma processing apparatus 1, a processing gas is supplied from the gas supply part 22 into the chamber 10. Then, the DC voltage pulse or the high-frequency power from the high-frequency power supply 26 is applied to the upper electrode 20. As a result, plasma is generated from the process gas in the chamber 10. The substrate W on the substrate support 14 is processed by chemical species from the generated plasma. For example, the chemical species from the plasma form a film on the substrate W. Alternatively, the chemical species from the plasma etch the substrate W.

The plasma processing apparatus 1 further includes a phase control circuit 40. The phase control circuit 40 includes a semiconductor switch, and is connected to the lower electrode 18. The phase control circuit 40 is configured to adjust the impedance of the lower electrode 18.

Figure 2:
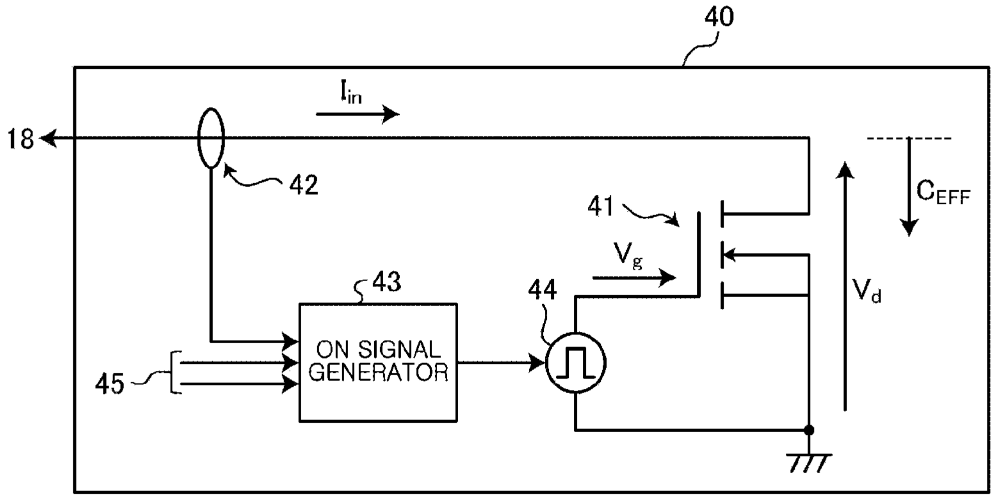
FIG. 2 shows an example of a phase control circuit according to the embodiment.
Figure 3:
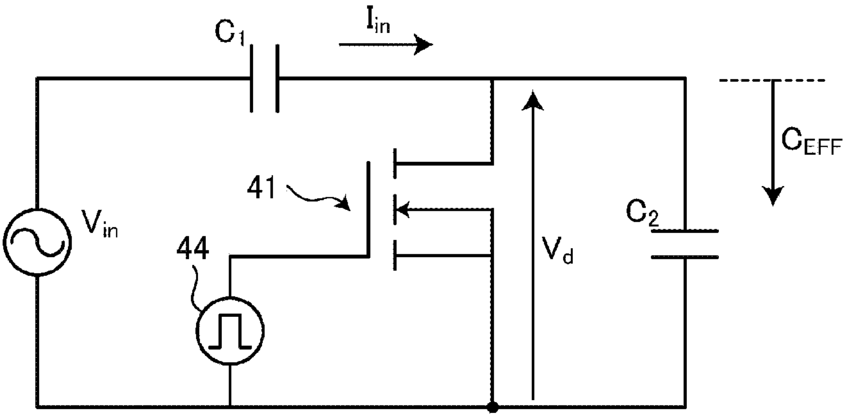
FIG. 3 shows an example of a phase control circuit including a signal source.

Here, the phase control circuit 40 will be described in detail with reference to FIGS. 2 and 3. FIG. 2 shows an example of a phase control circuit in the present embodiment. FIG. 3 shows an example of a phase control circuit including a signal source. As shown in FIGS. 2 and 3, the phase control circuit 40 includes a field effect transistor (FET) 41, a detector 42, and a generator 43. Further, in the circuit of FIG. 3, a capacitor $C_1$ connected between the lower electrode 18 and the drain of the FET 41 and a capacitor $C_2$ connected in parallel with the FET 41, which are used for blocking DC, are illustrated. In other words, the phase control circuit 40 may include the capacitors $C_1$ and $C_2$. The capacitors $C_1$ and $C_2$ are examples of capacitive elements. Further, the capacitor $C_2$ may be omitted. In FIGS. 2 and 3, a high-frequency current $I_{in}$ flowing from the lower electrode 18 to the FET 41, a drain-source voltage $V_d$ of the FET 41, and a combined capacitance $C_{EFF}$ of the FET 41 and the capacitor $C_2$ are illustrated. Further, FIG. 2 shows a gate voltage Vg of the FET 41, and FIG. 3 shows a voltage $V_{in}$ of a signal source corresponding to a voltage measured at the lower electrode 18. In the present embodiment, the combined capacitance $C_{EFF}$ is a capacitance to be varied.

The FET 41 is an example of a semiconductor switch, and is connected between the lower electrode 18 and the ground. The FET 41 is used as a variable reactance capable of performing high-speed response, instead of a conventional mechanically driven vacuum variable capacitor. In the FET 41, the drain and the source are in a conductive state by inputting an ON signal 44 as a control signal from the generator 43 into the gate. In other words, in the FET 41, in the conductive state, the drain-source voltage $V_d$ becomes 0 V. Further, the FET 41 is, e.g., an N-channel FET, and has its drain connected to the lower electrode 18 and its source connected to the ground (earth) side. Further, the FET 41 may be a P-channel FET. In that case, a direction of a parasitic diode in an equivalent circuit to be described later is reversed, and a direction of a current flowing into the FET is also reversed.

The detector 42 is disposed between the lower electrode 18, which is on the high-frequency power supply 26 side, and the FET 41. In the circuit of FIG. 3, the detector 42 is disposed between the capacitor $C_1$ and the drain of the FET 41. The detector 42 detects the high-frequency current $I_{in}$ flowing from the lower electrode 18 to the FET 41. Further, the high-frequency current $I_{in}$ is a high-frequency current that flows from the high-frequency power supply 26 to the FET 41 through the matching box 28, the processing space 10*s*, the lower electrode 18, and the capacitor $C_1$. The detector 42 may be, e.g., a directional coupler, a VI probe, or the like. The detector 42 outputs information on the detected current to the generator 43. The detected current information is, e.g., waveform information on the high-frequency current $I_{in}$. Further, instead of the high-frequency current $I_{in}$, the high-frequency voltage of the drain terminal of the FET 41 may be detected by the detector, and the detected information may be used instead of the current.

The generator 43 generates the ON signal 44, which is a control signal for the FET 41, based on the information on the current output from the detector 42. Further, the ON signal 44 is an example of a gate signal for the FET 41. Further, process timing information 45 is output from the controller 2 to the generator 43. The process timing information 45 includes, as processing conditions, a type and a flow rate of the processing gas supplied to the processing space 10*s*, a high-frequency signal supplied by the high-frequency power supply 26, and a pressure and a temperature in the chamber 10, for example. The generator 43 may generate the ON signal 44, which is the control signal for the FET 41, based on the information on the current output from the detector 42 and the process timing information 45. In other words, the generator 43 may change the duration of the ON signal 44 in one cycle of the current output from the detector 42 depending on the processing conditions.

In other words, the generator 43 may generate the ON signal 44 based on the information on the current output from the detector 42 and the switching of the type of the processing gas supplied to the processing space 10*s*. Further, the generator 43 may change the duration of the ON signal 44 in one period of the current output from the detector 42 depending on the type of the processing gas. Further, the generator 43 may generate the ON signal 44 based on the information on the current output from the detector 42 and the switching of the flow rate of the processing gas supplied to the processing space 10*s*. The generator 43 may change the duration of the ON signal 44 in one period of the current output from the detector 42 depending on the flow rate of the processing gas. Further, when the information on the current output from the detector 42 is a pulse waveform having a specific pulse width, the generator 43 may generate the ON signal 44 based on the pulse waveform. Further, the generator 43 may change the duration of the ON signal 44 in one period of the current output from the detector 42 depending on the pulse waveform. Further, the generator 43 may generate the ON signal 44 based on the information on the current output from the detector 42 and the bias signal supplied to the upper electrode 20. Further, the generator 43 may change the duration of the ON signal 44 in one period of the current output from the detector 42 depending on the bias signal.

The ON signal 44 is generated, as a signal shorter than one period of the high-frequency current $I_{in}$, in synchronization with the high-frequency signal output from the high-frequency power supply 26, i.e., the frequency of the high-frequency current $I_{in}$ detected by the detector 42, for example. When the high-frequency current $I_{in}$ is a sine wave, for example, a signal shorter than one period of the sine wave is output, as the ON signal 44, for each period of the sine wave.

Further, the phase control circuit 40 may include an inductive element such as a coil at one or more positions between the lower electrode 18 and the detector 42 and between the source of the FET 41 and the ground. In other words, the phase control circuit 40 may include an inductive element such as a coil at one or more positions between the position closer to the high-frequency power supply 26 side than the detector 42 and the position closer to the ground side than the FET 41. In other words, the phase control circuit 40 does not include an inductive element between the detector 42 and the source of the FET 41, so that the influence of the inductive element may be eliminated in generating the ON signal 44. In this case, the inductive element does not include a parasitic inductance of a wiring between the detector 42 and the source of the FET 41, because the influence thereof is negligible.

<Conduction Angle α of FET>

Figure 4:
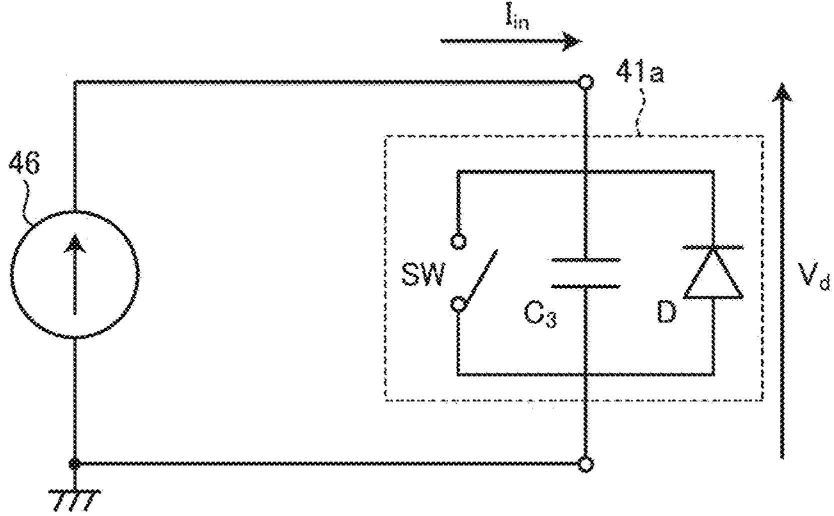
FIG. 4 shows an example of an equivalent circuit of a field effect transistor (FET).

Next, a conduction angle α, which expresses the conductive state between the drain and the source of the FET 41 using an angle in one period of the high-frequency current $I_{in}$, will be described with reference to FIGS. 4 to 7. FIG. 4 shows an example of an equivalent circuit of the FET. The equivalent circuit 41*a* of the FET 41 shown in FIG. 4 is expressed as a parallel circuit of a switch SW, a capacitor $C_3$, and a diode D (parasitic diode). In the equivalent circuit 41*a*, when the high-frequency current $I_{in}$ is applied from the sine wave current source 46, the voltage across the equivalent circuit 41*a* becomes the drain-source voltage $V_d$.

In the FET 41, in order to reduce switching loss, it is desirable to perform zero voltage switching for switching on/off of the drain-source voltage $V_d$ at the timing of 0 V in the case where no diode D is used. Therefore, in the present embodiment, it is considered to use either a positive or a negative half-wave region of one cycle of the waveform of the sine wave of the voltage $V_d$. In the equivalent circuit 41*a*, in the case of using the positive half-wave region of the sine wave, the switch SW is ON in the negative half-wave region, so that the positive half-wave region of the sine wave of the current source 46 appears as the voltage $V_d$. However, in the case of using the negative half-wave region of the sine wave, the switch SW is ON in the positive half-wave region, and the drain and the source are in a conductive state in the negative half-wave region by the diode D, so that the negative half-wave region of the sine wave of the current source 46 does not appear as the voltage $V_d$. Hence, in the equivalent circuit 41*a*, a positive half-wave can be generated as the voltage $V_d$, but it is difficult to generate a negative half-wave. Accordingly, in the present embodiment, the positive region of one cycle of the waveform of the sine wave of the voltage $V_d$ is used.

Figure 5:
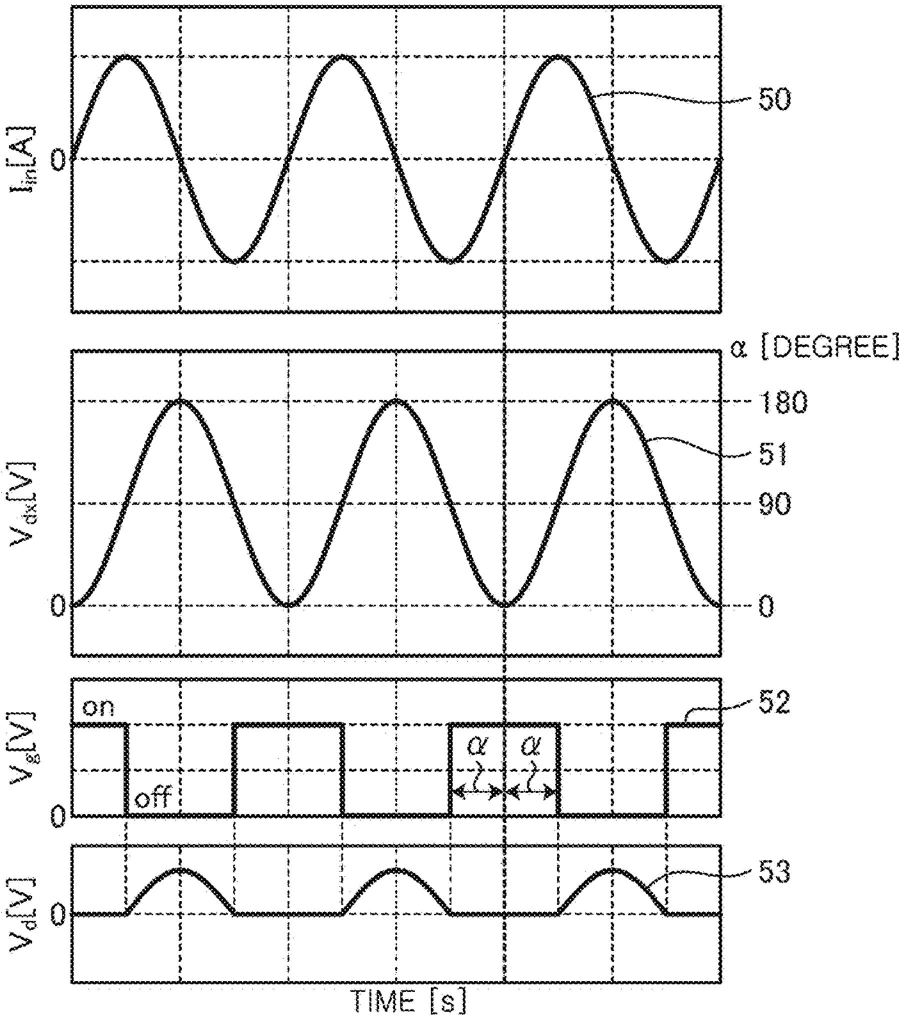
FIG. 5 shows an example of the relationship between a conduction angle of an ON signal and a drain-source voltage waveform of a FET.

FIG. 5 shows an example of the relationship between the conduction angle of the ON signal and the drain-source voltage waveform of the FET. As shown in FIG. 5, the voltage $V_d$ is delayed in phase by 90 degrees with respect to graph 50 of the high-frequency current $I_{in}$. FIG. 5 shows graph 51 of a voltage $V_{dx}$ charged to a combined capacitance $C_{EFF}$ in the case where the switch SW is off, which is a voltage corresponding to the voltage $V_d$. In other words, the voltage $V_{dx}$ is a positive value obtained by integrating the high-frequency current $I_{in}$. Further, the vertical axis on the right side of graph 51 represents the corresponding conduction angle α. In FIG. 5, a zero cross point at the time of shifting of the waveform of graph 50 of high-frequency current $I_{in}$ from the negative side to the positive side, i.e., the peak on the 0 V side of graph 51 of the voltage $V_{dx}$, is set as the reference point for the duration of the ON signal 44.

As shown in graph 52 of the gate voltage Vg, the duration of the ON signal 44 has sections corresponding to the phase of the high-frequency current $I_{in}$ of the same angle (conduction angle α) in phase-advance and phase-delay directions with respect to the reference point. In other words, when the conduction angle α is 0 degrees, the switch SW is OFF for one cycle, and when the conduction angle α is 180 degrees, the switch SW is ON for one cycle. In the example of FIG. 5, in graph 52 of the gate voltage Vg, on/off is switched at the timing where the conduction angle α becomes 90 degrees to correspond to the half wave on the 0 V side of graph 51.

In graph 53 of the voltage $V_d$, the voltage $V_d$ becomes 0 V in the section of graph 51 of voltage $V_{dx}$ where the gate voltage $V_g$ is ON, i.e., in the section corresponding to twice the conduction angle α, because the drain and the source are in a conductive state. On the other hand, in the section where gate voltage $V_g$ is OFF, a voltage corresponding to graph 51 of voltage $V_{dx}$ appears. In other words, graph 53 of voltage $V_d$ has a waveform corresponding to the positive half wave of the voltage $V_{dx}$.

Figure 6:
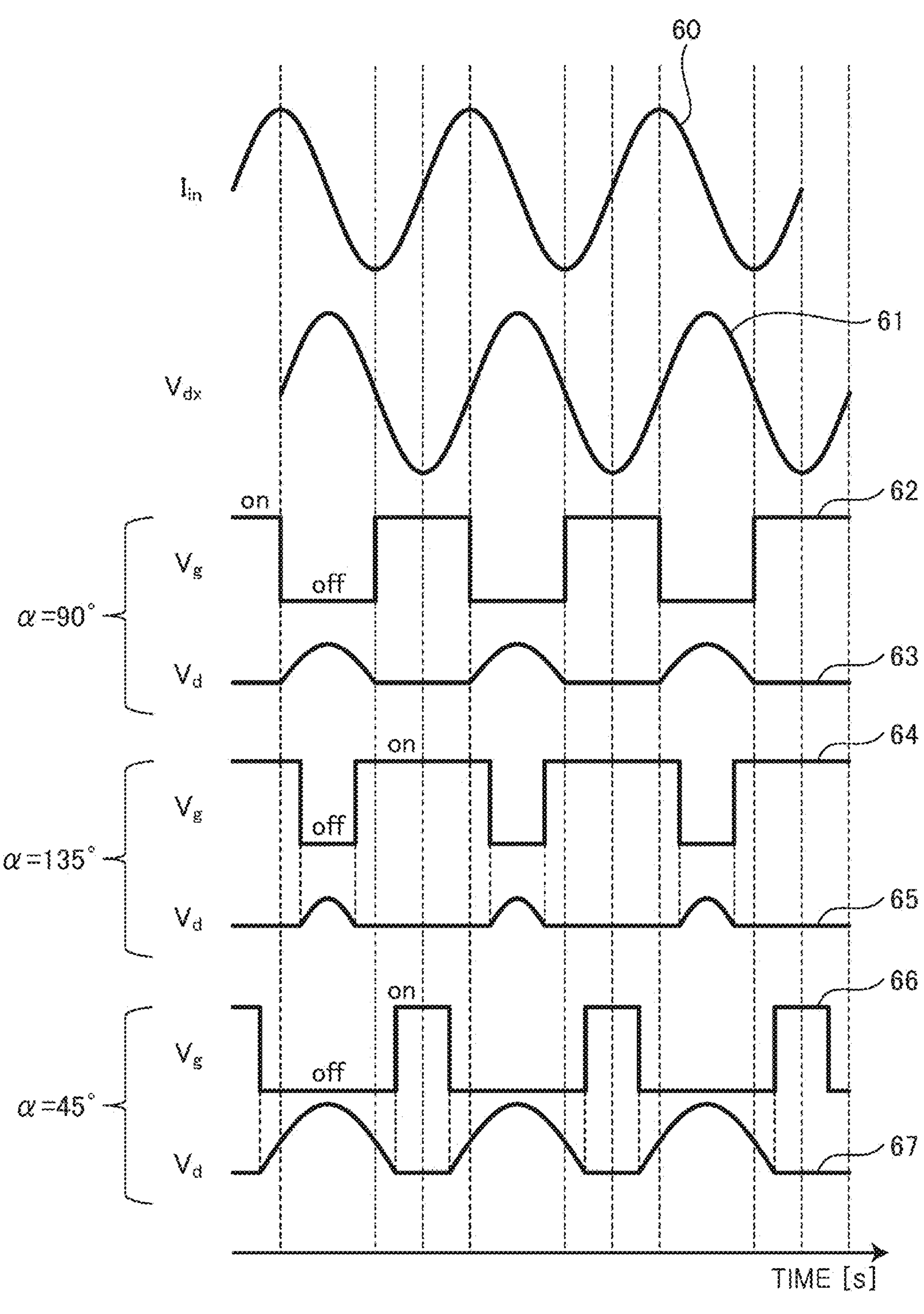
FIG. 6 shows an example of a change in the drain-source voltage waveform of a FET in the case of changing a conduction angle of an ON signal.

FIG. 6 shows an example of changes in a drain-source voltage waveform of an FET in the case of changing the conduction angle of the ON signal. FIG. 6 shows graphs 62 to 67 of the gate voltage $V_g$ and the voltage $V_d$ in the case of setting the conduction angle α to 90 degrees, 135 degrees, and 45 degrees (shown as 90°, 135°, and 45° in FIG. 6) with respect to graph 60 of the high-frequency current $I_{in}$ and graph 61 of the voltage $V_{dx}$.

In graphs 62 and 63, the conduction angle α is 90 degrees, so that the voltage $V_d$ corresponding to a duration that is a half of one cycle of the high-frequency current $I_{in}$ appears, similarly to graphs 52 and 53 in FIG. 5. In graphs 64 and 65, the conduction angle α is 135 degrees, so that, in one cycle of the high-frequency current $I_{in}$, the ON duration of the gate voltage $V_g$ becomes longer than the OFF duration thereof, and the duration in which the drain and the source are in a conductive state becomes longer. Therefore, when the conduction angle α is 135 degrees, the duration in which the voltage $V_d$ appears becomes shorter compared to the case where the conduction angle α is 90 degrees, and the peak of the voltage $V_d$ becomes lower, as shown in graph 65. In graphs 66 and 67, the conduction angle α is 45 degrees, so that, in one cycle of the high-frequency current $I_{in}$, the ON duration of the gate voltage $V_g$ becomes shorter than the OFF duration thereof, and the duration in which the drain and the source are in a conductive state becomes shorter. Therefore, when the conduction angle α is 45 degrees, the duration in which the voltage $V_d$ appears becomes longer compared to the case where the conduction angle α is 90 degrees, and the peak of the voltage Va becomes higher, as shown in graph 67. Further, as shown in graphs 63, 65, and 67, the voltage $V_d$ becomes 0 V at the time of switching ON/OFF, so that zero-voltage switching is performed.

Figure 7:
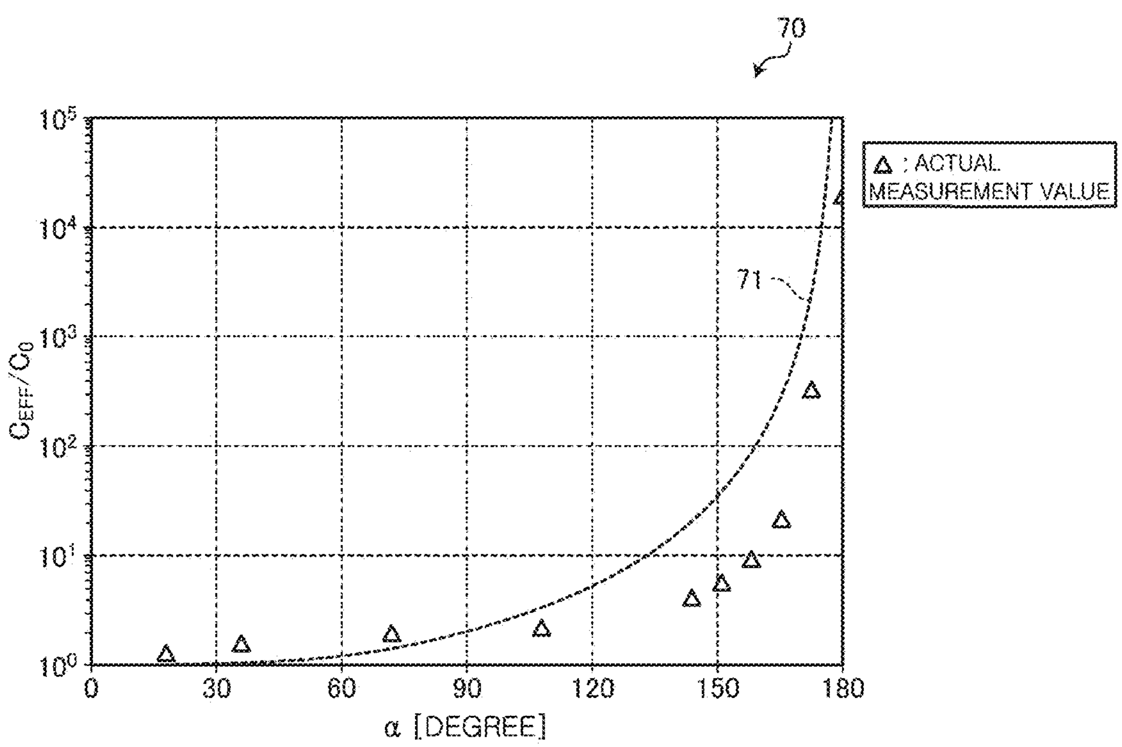
FIG. 7 is a graph showing an example of the relationship between a conduction angle of an ON signal and a capacitance component of a lower electrode.

FIG. 7 is a graph showing an example of the relationship between the conduction angle of the ON signal and the capacitance component of the lower electrode. In graph 70 shown in FIG. 7, the horizontal axis represents the conduction angle α degrees, and the vertical axis represents the ratio of the combined capacitance $C_{EFF}$ to the combined capacitance $C_0$ of the parasitic capacitance (the capacitor $C_3$) of the FET 41 and the capacitor $C_2$ in the case where the FET 41 is OFF. Here, in graph 70, triangles indicate actual measurement values, and graph 71 indicates values of theoretical equation. Here, the theoretical equation for the ratio of the combined capacitance $C_{EFF}$ to the combined capacitance $C_0$ is expressed by the following Eq. (1). Further, the actual measurement value can be obtained from the following Eq. (2).

$$C_{EFF} = \frac{\pi}{\pi - \alpha + \sin(\alpha)\cos(\alpha)} C_0 \quad \text{Eq. (1)}$$

$$C_{EFF} = \frac{1}{V_d} \int I_{in} dT \quad \text{Eq. (2)}$$

In Eq. (1), when the conduction angle α is 0 degrees, the combined capacitance $C_{EFF}$ is equal to the combined capacitance $C_0$, and the value of the combined capacitance $C_{EFF}$ increases by increasing the conduction angle α from 0 degrees. In other words, in the present embodiment, the capacitance component between the drain and the source of the FET 41 can be continuously (smoothly) controlled by controlling the conduction angle α. In other words, the phase control circuit 40 controls the gate voltage $V_g$ using the ON signal 44 having a predetermined conduction angle α, which is generated based on information on the high-frequency current $I_{in}$ detected by the detector 42, so that the impedance of the lower electrode 18 can be controlled to follow the frequency of the high-frequency signal.

Referring back to the description of FIG. 1, the controller 2 processes computer-executable instructions that cause the plasma processing apparatus 1 to execute various steps described in this disclosure. The controller 2 may be configured to control individual components of the plasma processing apparatus 1 to execute various steps described herein. In one embodiment, the controller 2 may be partially or entirely included in the plasma processing apparatus 1. The controller 2 may include a processing part **2*a*1, a storage part 2*a*2, and a communication interface 2*a*3. The controller 2 is realized by a computer 2*a*, for example. The processing unit 2*a*1 may be configured to perform various control operations by reading a program from the storage part 2*a*2 and executing the read program. The program may be stored in the storage part 2*a*2 in advance, or may be acquired via a medium, when necessary. The acquired program is stored in the storage part 2*a*2, and is read from the storage part 2*a*2 by the processing unit 2*a*1 and executed. The medium may be various storage media that are readable by the computer 2*a*, or may be a communication line connected to the communication interface 2*a*3. The processing part 2*a*1 may be a central processing unit (CPU). The memory part 2*a*2 may include a random access memory (RAM), a read only memory (ROM), a hard disk drive (HDD), a solid state drive (SSD), or combination thereof. The communication interface 2_a_3 may communicate with the plasma processing apparatus 1** via a communication line such as a local area network (LAN) or the like.

The controller 2 can perform predetermined control according to the selected process recipe. For example, the controller 2 controls individual components of the plasma processing apparatus 1 to perform a plasma processing method to be described later. As a specific example, the controller 2 executes a process of preparing the substrate W by loading the substrate W into the chamber 10. The controller 2 executes a process of supplying a processing gas into the chamber 10 to produce plasma, and performing plasma processing on the substrate W using the produced plasma. Here, the plasma processing may be, e.g., film formation, etching, or another processing. Further, when the plasma processing is performed on the substrate W to be processed in the processing space 10_s_ in the chamber 10, the controller 2 outputs the process timing information to the phase control circuit 40 according to the process recipe in the plasma processing. Further, the controller 2 may output other control information to the phase control circuit 40.

<Plasma Processing Method>

Figure 8:
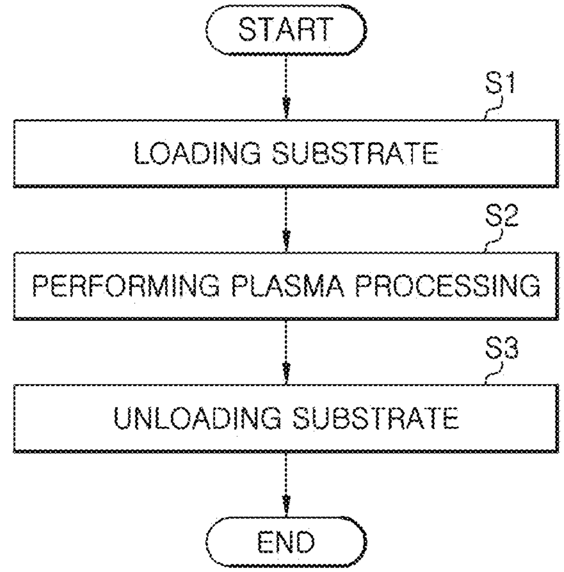
FIG. 8 is a flowchart showing an example of plasma processing in the embodiment.

Next, plasma processing according to the present embodiment will be described as a plasma processing method. FIG. 8 is a flowchart showing an example of plasma processing in the present embodiment.

The controller 2 opens a loading/unloading port (not shown) by controlling a gate valve (not shown). When the loading/unloading port is opened, the substrate W is loaded into the processing space 10_s_ of the chamber 10 through the loading/unloading port and placed on the substrate support 14. In other words, the controller 2 controls the plasma processing apparatus 1 to load the substrate W into the chamber 10 (step S1). The controller 2 may be a control device for an entire substrate processing system (not shown), including the plasma processing apparatus 1 and a transfer device disposed in a transfer chamber (not shown) adjacent to the chamber 10. The controller 2 closes the loading/unloading port by controlling the gate valve.

The controller 2 reduces a pressure in the chamber 10 to a predetermined pressure by controlling the exhaust device 24 connected to the exhaust port 12_e_. The controller 2 controls the gas supply part 22 to supply a plasma generating gas to the chamber 10 from the plurality of gas holes 20_h_. The controller 2 controls the high-frequency power supply 26 to ignite plasma with a predetermined power. The controller 2 executes a plasma processing step in which plasma processing is performed on the substrate W using the plasma of the plasma generating gas for a predetermined time (step S2).

When the plasma processing is performed on the substrate W in the plasma processing step, the controller 2 outputs the process timing information to the phase control circuit 40 according to the process recipe in the plasma processing. In other words, the controller 2 outputs the control information to the phase control circuit 40 to adjust the duration of the ON signal 44 of the FET 41 according to the processing conditions of the plasma processing.

For example, the controller 2 controls the phase control circuit 40 such that the impedance of the lower electrode 18 draws the high-frequency current $I_{in}$. Accordingly, it is possible to increase the overall plasma density on the substrate W. Further, for example, the controller 2 controls the phase control circuit 40 such that the impedance of the lower electrode 18 does not draw the high-frequency current $I_{in}$. Accordingly, it is possible to increase the plasma density at the periphery of the substrate W. Further, for example, the controller 2 controls the phase control circuit 40 such that the impedance of the lower electrode 18 draws a harmonic current generated in the processing space 10_s_ of the chamber 10. Accordingly, it is possible to increase the plasma density at the center of the substrate W. In other words, the controller 2 can control the in-plane distribution of the plasma by controlling the impedance of the lower electrode 18 by adjusting the reactance with the phase control circuit 40.

When the plasma processing step is completed, the controller 2 stops the high-frequency signal to stop the plasma generation. Further, the controller 2 controls the gate valve to open the loading/unloading port. The controller 2 controls the plasma processing apparatus 1 such that substrate support pins (not shown) protrude from the upper surface of the substrate support 14 to lift the substrate W. When the loading/unloading port is opened, the substrate W is unloaded from the chamber 10 by an arm of the transfer chamber (not shown) through the loading/unloading port. In other words, the controller 2 controls the plasma processing apparatus 1 such that the substrate W is unloaded from the chamber 10 (step S3). In this manner, the controller 2 can control the impedance of the lower electrode 18 by adjusting the reactance with the phase control circuit 40 even during the plasma processing.

Application Example

Figure 9:
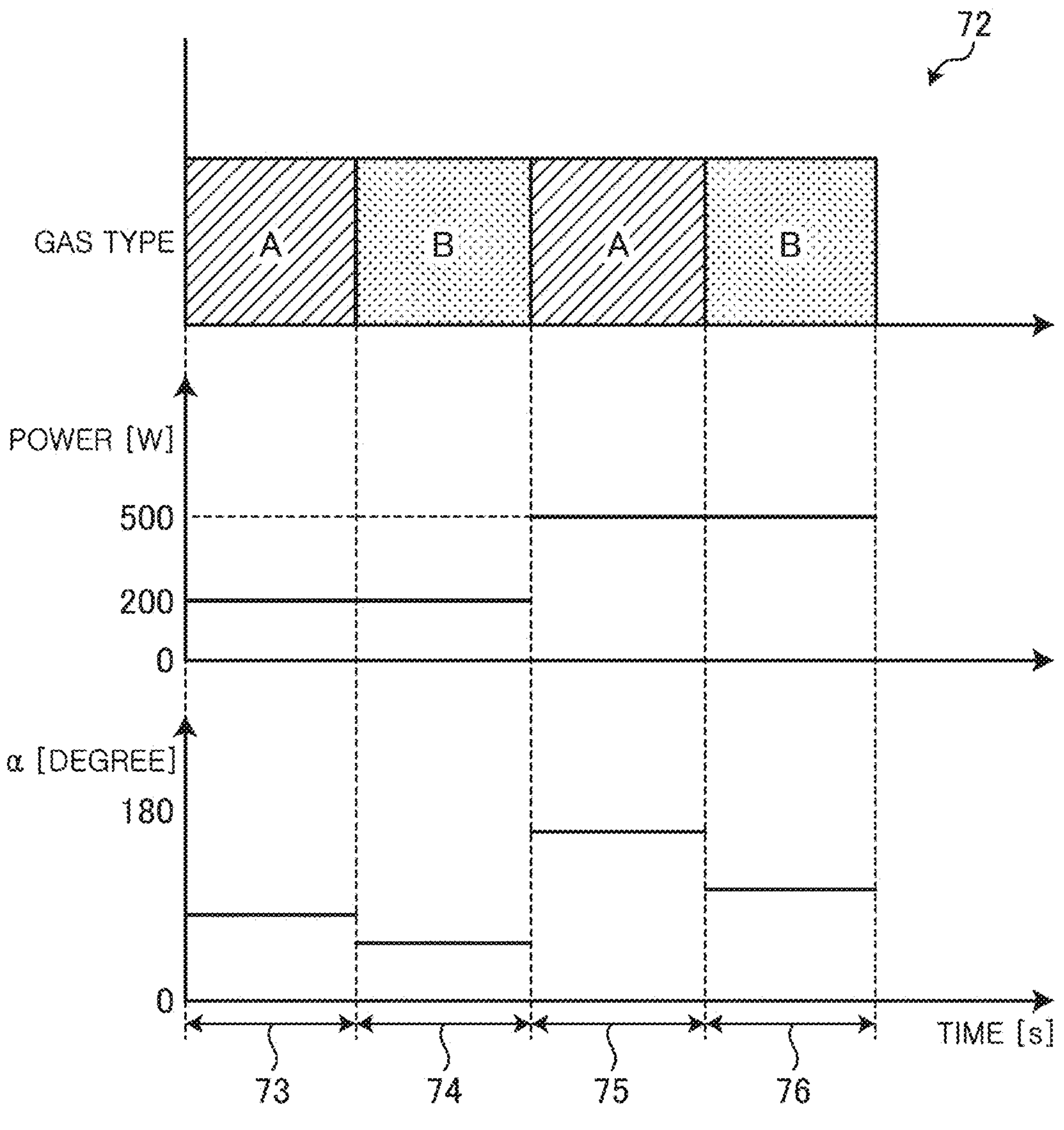
FIG. 9 is a graph showing an example of the case of changing a conduction angle of an ON signal depending on a gas type and a high-frequency power.

Next, an application example of the present embodiment will be described with reference to FIG. 9. FIG. 9 is a graph showing an example of the case of changing the conduction angle of the ON signal depending on a gas type and a high-frequency power. Graph 72 in FIG. 9 shows a case where an impedance of the lower electrode 18 is controlled by changing the conduction angle $\alpha$ of the ON signal 44 in synchronization in the case of switching a gas type and a high-frequency power in ALP, for example. In graph 72, in sections 73 to 76, one or more of the gas type and the high-frequency power are switched in a stepwise manner, for example. In section 73, the gas type is set to a gas type A, the high-frequency power is set to 200 W, and the conduction angle $\alpha$ is set to 90 degrees. In section 74, the gas type is switched to a gas type B, the high-frequency power is maintained at 200 W, and the conduction angle $\alpha$ is switched to 75 degrees, for example. In section 75, the gas type is switched to the gas type A, the high-frequency power is switched to 500 W, and the conduction angle $\alpha$ is switched to 160 degrees, for example. In section 76, the gas type is switched to the gas type B, the high-frequency power is maintained at 500 W, and the conduction angle $\alpha$ is switched to 135 degrees, for example. Accordingly, the plasma processing apparatus 1 can control the impedance of the lower electrode 18 in synchronization with the process recipe in response to changes in plasma depending on process recipes.

For another example, the high-frequency power supply 26 may supply a high-frequency signal of a pulse waveform having a specific pulse width, and the ON signal 44 may be generated based on the pulse waveform. In this case, the specific pulse width may be a pulse width in units of microseconds (μs) to milliseconds (ms). For example, the specific pulse width is 1 μs to 1000 ms. In this case, in the plasma processing apparatus 1, the impedance control of the lower electrode 18 in synchronization with the pulse timing can be performed in response to changes in plasma or plasma ignition in an extremely short time (so-called pulse plasma).

For another example, the ON signal 44 may be generated based on a bias signal supplied to the upper electrode 20. The bias signal is supplied to the upper electrode 20, for example. Further, the bias signal may include a DC power supply. Further, the bias signal may be, e.g., a 400 kHz high-frequency signal (high-frequency power), a single pulse of a DC voltage or a continuous pulse that is a periodic pulse, a DC voltage, or the like. The pulse width of the single pulse or the continuous pulse of the DC voltage may be, e.g., a pulse within a range of 1 μs to 10 s. In this case, the plasma processing apparatus 1 can perform the impedance control of the lower electrode 18 based on the on/off timing of the bias signal and the current value (corresponding to the above-described high-frequency current $I_{in}$) of the lower electrode 18. In other words, the plasma processing apparatus 1 can optimize the plasma distribution according to the processing conditions.

For another example, the ON signal 44 may be controlled based on various monitor values in response to sudden changes in plasma due to abnormal discharge, changes in a pressure value, or the like. The various monitor values may be, e.g., the flow rate of the processing gas supplied to the processing space 10*s*, the plasma density and the electron temperature in the processing space 10*s*, the voltage and the current of the high-frequency power, the pressure and the temperature in the chamber 10, and the like. In this case, the plasma processing apparatus 1 can control the impedance of the lower electrode 18 based on various monitor values. In other words, the plasma processing apparatus 1 can suppress sudden changes in plasma due to disturbance.

As described above, in accordance with the present embodiment, the plasma processing apparatus 1 includes the processing chamber (the chamber 10), the application electrode (the upper electrode 20), the counter electrode (the lower electrode 18), and the phase control circuit 40. The processing chamber is configured to form the processing space 10*s*. The application electrode is configured to be disposed on one side of the processing space 10*s*, and is connected to the high-frequency power supply 26. The counter electrode is configured to be disposed on the other side of the processing space 10*s*. The phase control circuit 40 is configured to include the semiconductor switch (e.g., the FET 41), and is connected to the counter electrode. The ON signal 44 that is shorter than one cycle of the high-frequency signal is input, as a control signal, to the semiconductor switch in synchronization with the frequency of the high-frequency signal output from the high-frequency power supply 26. As a result, the impedance of the counter electrode can be controlled to follow the frequency of the high-frequency signal.

Further, in accordance with the present embodiment, the phase control circuit 40 is configured to further include the detector 42 disposed between the high-frequency power supply 26 and the semiconductor switch and configured to detect a current of a high-frequency signal. The ON signal 44 is generated based on the current detected by the detector 42. As a result, the impedance of the counter electrode can be controlled to follow the frequency of the high-frequency signal.

Further, in accordance with the present embodiment, the phase control circuit 40 includes the capacitive element (the capacitor C1 and/or the capacitor C2). As a result, the DC component can be blocked. Further, the capacitance component between the drain and the source of the FET 41 can be adjusted.

Further, in accordance with the present embodiment, the phase control circuit 40 includes an inductive element at one or more positions between a position closer to the high-frequency power supply 26 than the detector 42 and a position closer to the ground side than the semiconductor switch. As a result, the influence of the inductive element can be eliminated in generating the ON signal 44.

Further, in accordance with the present embodiment, the ON signal 44 is generated based on the switching of the gas type of the processing gas supplied to the processing space 10*s*. As a result, the impedance of the counter electrode can be controlled in synchronization with the process recipe.

Further, in accordance with the present embodiment, the ON signal 44 is generated based on the switching of the flow rate of the processing gas supplied to the processing space 10*s*. As a result, the impedance of the counter electrode can be controlled in synchronization with the process recipe.

Further, in accordance with the present embodiment, the high-frequency signal is a high-frequency signal of a pulse waveform having a specific pulse width. Further, the ON signal 44 is generated based on the pulse waveform. As a result, the impedance of the counter electrode can be controlled in synchronization with the pulse timing.

Further, in accordance with the present embodiment, the ON signal 44 is generated based on the bias signal supplied to the application electrode. As a result, the impedance of the counter electrode can be controlled based on the ON/OFF timing of the bias signal.

Further, in accordance with the present embodiment, the ON signal 44 is generated by taking the zero cross point, where the waveform of the high-frequency current changes from the negative side to the positive side, as the reference point for the duration of the ON signal 44. As a result, the switching loss of the FET 41 can be reduced.

Further, in accordance with the present embodiment, the duration of the ON signal 44 has sections corresponding to the phase of the current of the same angle in phase-advance and phase-delay directions with respect to the reference point. As a result, the switching loss of the FET 41 can be reduced.

Further, in accordance with the present embodiment, the semiconductor switch is the FET 41. Further, the ON signal 44 causes conduction between the drain and the source of the FET 41. As a result, the capacitance component between the drain and the source of the FET 41 can be controlled.

Further, in accordance with the present embodiment, the plasma processing method, which is the plasma processing method in the plasma processing apparatus 1, includes inputting the ON signal 44 shorter than one cycle of the RF signal in synchronization with the frequency of the high-frequency signal output from the high-frequency power supply 26 into the semiconductor switch of the phase control circuit 40 connected to the counter electrode between the application electrode connected to the high-frequency power supply 26 and the counter electrode facing the application electrode, which are disposed in the processing space 10*s* in the processing chamber. Further, the duration of the ON signal 44 changes depending on the processing conditions. As a result, the impedance control of the counter electrode in synchronization with the process recipe can be performed.

It should be noted that the embodiments of the present disclosure are illustrative in all respects and are not restrictive. The above-described embodiments may be omitted, replaced, or changed in various forms without departing from the scope of the appended claims and the gist thereof.

Further, in the above embodiment, the case where an RF signal is supplied to the upper electrode 20 and the lower electrode 18 is grounded via the phase control circuit 40 has been described, but the present disclosure is not limited thereto. For example, a high-frequency signal may be supplied to the lower electrode 18, and the upper electrode 20 may be grounded via the phase control circuit 40.

Further, the present disclosure can also have the following configuration.

(1) A plasma processing apparatus comprising:

a processing chamber configured to form a processing space;

an application electrode disposed on one side of the processing space and connected to a high-frequency power supply;

a counter electrode disposed on the other side of the processing space; and a phase control circuit configured to include a semiconductor switch and connected to the counter electrode, wherein an ON signal shorter than one cycle of a high-frequency signal output from the high-frequency power supply is input to the semiconductor switch in synchronization with the frequency of the high-frequency signal.

(2) The plasma processing apparatus of (1), wherein the phase control circuit is configured to further include a detector disposed between the high-frequency power supply and the semiconductor switch and configured to detect a current of the high-frequency signal, and the ON signal is generated based on the current detected by the detector.

(3) The plasma processing apparatus of (1) or (2), wherein the phase control circuit includes a capacitive element.

(4) The plasma processing apparatus of (2) or (3), wherein the phase control circuit includes an inductive element at one or more positions between a position closer to the high-frequency power supply than the detector and a position closer to the ground than the semiconductor switch.

(5) The plasma processing apparatus of any one of (1) to (4), wherein the ON signal is generated based on switching of a gas type of a processing gas supplied to the processing space.

(6) The plasma processing apparatus of any one of (1) to (4), wherein the ON signal is generated based on switching of a flow rate of a processing gas supplied to the processing space.

(7) The plasma processing apparatus of any one of (1) to (4), wherein the high-frequency signal is a pulse waveform having a specific pulse width, and the ON signal is generated based on the pulse waveform.

(8) The plasma processing apparatus of any one of (1) to (4), wherein the ON signal is generated based on a bias signal supplied to the application electrode.

(9) The plasma processing apparatus of any one of (2) to (8), wherein the ON signal is generated by taking a zero cross point, where the waveform of the current of the high-frequency signal changes from a negative side to a positive side, as a reference point for a duration of the ON signal.

(10) The plasma processing apparatus of (9), wherein the duration of the ON signal has sections corresponding to a phase of the current of the same angle in phase-advance and phase-delay directions with respect to the reference point.

(11) The plasma processing apparatus of any one of (1) to (10), wherein the semiconductor switch is a field effect transistor (FET), and the ON signal is a signal that causes conduction between the drain and the source of the FET.

(12) A plasma processing method in a plasma processing apparatus, comprising:

inputting an ON signal shorter than one cycle of a high-frequency signal output from a high-frequency power supply in synchronization with the frequency of the high-frequency signal into a semiconductor switch of a phase control circuit connected to a counter electrode, wherein an application electrode connected to the high-frequency power supply and the counter electrode facing the application electrode are disposed in a processing space in a processing chamber, wherein the duration of the ON signal changes depending on a processing condition.

(13) The plasma processing method of (12), wherein the processing condition is a gas type of a processing gas supplied to the processing space.

(14) The plasma processing method of (12), wherein the processing condition is a flow rate of a processing gas supplied to the processing space.

(15) The plasma processing method of (12), wherein the high-frequency signal is a pulse waveform having a specific pulse width, and the processing condition is the pulse waveform.

(16) The plasma processing method of (12), wherein the processing condition is a bias signal supplied to the application electrode.

The invention claimed is:

1. A plasma processing apparatus comprising:

a processing chamber configured to form a processing space;

an application electrode disposed on one side of the processing space and connected to a high-frequency power supply;

a counter electrode disposed on the other side of the processing space; and a phase control circuit configured to include a semiconductor switch and connected to the counter electrode, wherein an ON signal shorter than one cycle of a high-frequency signal output from the high-frequency power supply is input to the semiconductor switch in synchronization with the frequency of the high-frequency signal.

2. The plasma processing apparatus of claim 1, wherein the phase control circuit is configured to further include a detector disposed between the high-frequency power supply and the semiconductor switch and configured to detect a current of the high-frequency signal, and the ON signal is generated based on the current detected by the detector.

3. The plasma processing apparatus of claim 2, wherein the phase control circuit includes a capacitive element.

4. The plasma processing apparatus of claim 2, wherein the phase control circuit includes an inductive element at one or more positions between a position closer to the high-frequency power supply than the detector and a position closer to the ground than the semiconductor switch.

5. The plasma processing apparatus of claim 2, wherein the ON signal is generated based on switching of a gas type of a processing gas supplied to the processing space.

6. The plasma processing apparatus of claim 2, wherein the ON signal is generated based on switching of a flow rate of a processing gas supplied to the processing space.

7. The plasma processing apparatus of claim 2, wherein the high-frequency signal is a pulse waveform having a specific pulse width, and the ON signal is generated based on the pulse waveform.

8. The plasma processing apparatus of claim 2, wherein the ON signal is generated based on a bias signal supplied to the application electrode.

9. The plasma processing apparatus of claim 2, wherein the ON signal is generated by taking a zero cross point, where the waveform of the current of the high-frequency signal changes from a negative side to a positive side, as a reference point for a duration of the ON signal.

10. The plasma processing apparatus of claim 9, wherein the duration of the ON signal has sections corresponding to a phase of the current of the same angle in phase-advance and phase-delay directions with respect to the reference point.

11. The plasma processing apparatus of claim 2, wherein the semiconductor switch is a field effect transistor (FET), and the ON signal is a signal that causes conduction between the drain and the source of the FET.

12. A plasma processing method in a plasma processing apparatus, comprising:

inputting an ON signal shorter than one cycle of a high-frequency signal outputted output from a high-frequency power supply in synchronization with the frequency of the high-frequency signal into a semiconductor switch of a phase control circuit connected to a counter electrode, wherein an application electrode connected to the high-frequency power supply and the counter electrode facing the application electrode are disposed in a processing space in a processing chamber, wherein the duration of the ON signal changes depending on a processing condition.

13. The plasma processing method of claim 12, wherein the processing condition is a gas type of a processing gas supplied to the processing space.

14. The plasma processing method of claim 12, wherein the processing condition is a flow rate of a processing gas supplied to the processing space.

15. The plasma processing method of claim 12, wherein the high-frequency signal is a pulse waveform having a specific pulse width, and the processing condition is the pulse waveform.

16. The plasma processing method of claim 12, wherein the processing condition is a bias signal supplied to the application electrode.

* * * * *